(12) United States Patent
Guan

(10) Patent No.: US 10,748,499 B2
(45) Date of Patent: *Aug. 18, 2020

(54) GOA CIRCUIT

(71) Applicant: Wuhan China Star Optoelectronics Technology Co., Ltd., Wuhan, Hubei (CN)

(72) Inventor: Yanqing Guan, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 310 days.

This patent is subject to a terminal disclaimer.

(21) Appl. No.: 15/747,102

(22) PCT Filed: Nov. 27, 2017

(86) PCT No.: PCT/CN2017/113109
§ 371 (c)(1),
(2) Date: Jan. 23, 2018

(87) PCT Pub. No.: WO2019/095428
PCT Pub. Date: May 23, 2019

(65) Prior Publication Data
US 2020/0090609 A1 Mar. 19, 2020

(30) Foreign Application Priority Data
Nov. 17, 2017 (CN) .......................... 2017 1 1148865

(51) Int. Cl.
*G09G 3/36* (2006.01)
*H01L 27/12* (2006.01)

(52) U.S. Cl.
CPC .......... *G09G 3/3677* (2013.01); *H01L 27/124* (2013.01); *G09G 2300/0408* (2013.01);
(Continued)

(58) Field of Classification Search
CPC ......... G09G 3/3677; G09G 2300/0408; G09G 2310/0286; G09G 2320/0257; H01L 27/124
See application file for complete search history.

(56) References Cited

U.S. PATENT DOCUMENTS

2018/0197497 A1* 7/2018 Shao ................... G09G 3/3677
2019/0259338 A1* 8/2019 Li ........................ G09G 3/3266
2019/0355432 A1* 11/2019 Su ......................... G11C 19/28

* cited by examiner

*Primary Examiner* — Adam R. Giesy
(74) *Attorney, Agent, or Firm* — Hemisphere Law, PLLC; Zhigang Ma

(57) ABSTRACT

GOA circuit is disclosed comprising m stages GOA units, wherein a n-th stage GOA unit comprises: an output control module, a forward-backward scan control module, a node signal control module, a signal output module, a first pull-down circuit, a second pull-down circuit, and a pull-up circuit, wherein $m \geq n \geq 1$; output control module controls a n-th stage gate driving signal; first pull-down circuit comprises a 7th thin-film-transistor which first end connected with said output control module, and second end connected with low voltage signal; signal output module comprises a 5th thin-film-transistor which first end connected with high voltage signal and second end connected with third end of said 7th thin-film-transistor; node signal control module controls said 5th thin-film-transistor as conducting or non-conducting; second pull-down circuit controls said 5th thin-film-transistor as non-conducting. Present invention eliminates the sticking and flicker of display panels after out of power improving user experience.

18 Claims, 2 Drawing Sheets

(52) U.S. Cl.
CPC ............. *G09G 2310/0286* (2013.01); *G09G 2320/0257* (2013.01)

GOA CIRCUIT

RELATED APPLICATIONS

The present application is a National Phase of International Application Number PCT/CN2017/113109, filed on Nov. 27, 2017, and claims the priority of China Application No. 201711148865.2, filed on Nov. 17, 2017.

FIELD OF THE DISCLOSURE

The present invention relates to a display technical field, and more particularly to a GOA circuit.

BACKGROUND

Liquid crystal displays are widely applied in various electronic products as display member. More specifically, GOA (Gate Driver On Array, abbreviation: GOA) circuit is a critical component in liquid crystal display devices. A GOA circuit is one sort of technology using a conventional TFT array fabricate process to implement a gate scan driving signal circuit on array substrate, which realize the progressive scanning of gate driving.

Display panels based on Low Temperature Poly-silicon (abbreviation: LTPS) may be classified according to the types of Thin Film Transistor (abbreviation: TFT) adopted in panels into NMOS type, PMOS type, and CMOS type which comprises both NMOS and PMOS. Similarly, GOA circuit may be classified into NMOS circuit, PMOS circuit and CMOS circuit. NMOS circuit, in comparison with CMOS circuit, lacks PP (P doping, a.k.a. phosphorus ion doping) mask-fabricate process contributes to higher yield and lower cost significantly. A stable NMOS circuit is in industrially desired. In the situation of being out of power abnormally, if GOA circuit could not effectively realize ALL Gate On function (Setting all gate driving signals as valid voltage level, so as to execute liquid crystal display panel scanning simultaneously), the display panel would show sticking and flicker.

Take forward scanning for example, when there is out of power abnormally in GOA circuit unit illustrated in FIG. 1, the (n+1)-th clock signal feed in thin-film-transistor NT3 is in high voltage level. In this way, the forward scan control signal and (n+1)-th clock signal will be pulled down to low voltage level simultaneously causing the high voltage level of the gate of the thin-film-transistor NT5 may not be released further causing the thin-film-transistor NT5 kept conducting. Therefore, thin-film-transistor NT8 is also kept conducting. The high voltage signal VGH and the low voltage signal VGL may be in superposition with each other, thus, the gate of thin-film-transistor NT7 may not be pulled down completely causing the gate driving signal G(n) outputted by thin-film-transistor NT7 to thin-film-transistor of pixel units be pulled low. Therefore, the gate driving signal G(n) would be unable to open the thin-film-transistor of pixel units causing the charges of pixel electrode not be released in time. In the long run, the sticking and flicker would happen in the active area when the display panel is out of power abnormally.

SUMMARY

In order to solve above technical problem, present invention discloses a GOA circuit to eliminate the sticking and flicker of liquid crystal display panel after out of power.

The present invention discloses an embodiment of a GOA circuit adapted in a liquid crystal display panel comprising m stages GOA units, wherein a n-th stage GOA unit comprises: an output control module, a forward-backward scan control module, a node signal control module, a signal output module, a first pull-down circuit, a second pull-down circuit, and a pull-up circuit, wherein m n 1;

Wherein said forward-backward scan control module controls said GOA circuit to execute forward scan or backward scan according to whether a forward scan control signal or a backward scan control signal is;

Wherein said output control module is connected with said forward-backward scan control module to control a gate driving signal outputted by n-th stage when said GOA circuit is executing forward scan or backward scan;

Wherein said first pull-down circuit comprises a 7th thin-film-transistor which a first end of said 7th thin-film-transistor is connected with said output control module and a second end of said 7th thin-film-transistor is connected with low voltage signal;

Wherein said signal output module comprises a 5th thin-film-transistor which a first end of said 5th thin-film-transistor is connected with high voltage signal and a second end of said 5th thin-film-transistor is connected with a third end of said 7th thin-film-transistor;

Wherein said node signal control module is connected with a third end of said 5th thin-film-transistor so as to output a clock signal to said 5th thin-film-transistor in order to control said 5th thin-film-transistor as conducting or non-conducting;

Wherein said second pull-down circuit is connected with the third end of said 5th thin-film-transistor and adapted to pull down the voltage level of the third end of said 5th thin-film-transistor when said liquid crystal display panel is out of power so as to control said 5th thin-film-transistor as non-conducting;

Wherein said pull-up circuit comprises an 8th thin-film-transistor which a first end of said 8th thin-film-transistor is connected with the third end of said 7th thin-film-transistor, a second end of said 8th thin-film-transistor is connected with low voltage signal, a third end of said 8th thin-film-transistor is connected with a first global control signal;

Wherein said first end is one of source or drain, said second end is the other, and said third end is gate.

Preferably, said second pull-down circuit comprises a 14th thin-film-transistor which a second end of said 14th thin-film-transistor is connected with low voltage signal, a first end of said 14th thin-film-transistor is connected with the third end of said 5th thin-film-transistor, and a third end of said 14th thin-film-transistor is connected with said first global control signal.

Preferably, said pull-up circuit further comprises a 13th thin-film-transistor;

A first end and a third end of said 13th thin-film-transistor are both connected with the third end of said 8th thin-film-transistor, and a second end of said 13th thin-film-transistor is connected with the first end of said 7th thin-film-transistor.

Preferably, said GOA unit further comprises a voltage stabilizing circuit;

Wherein said voltage stabilizing circuit comprises a 9th thin-film-transistor, said output control module comprises a 6th thin-film-transistor, and said forward-backward scan control module comprises a 1st thin-film-transistor and a 2nd thin-film-transistor;

A first end of said 1st thin-film-transistor is connected with a forward scan control signal, a second end of said 1st thin-film-transistor is connected with a first end of said 9th thin-film-transistor;

A third end of said 9th thin-film-transistor is connected with high voltage signal, a second end of said 9th thin-film-transistor is connected with a third end of said 6th thin-film-transistor;

A first end of said 6th thin-film-transistor is connected with a n-th clock signal, a second end of said 6th thin-film-transistor is connected with the first end of said 7th thin-film-transistor, the connected node of said 6th thin-film-transistor and said 7th thin-film-transistor is adapted to be output port of a n-th stage gate driving signal;

A first end of said 2nd thin-film-transistor is connected with a backward scan control signal, a second end of said 2nd thin-film-transistor is connected with the second end of said 1st thin-film-transistor;

Wherein when n≥2, a third end of said 1st thin-film-transistor is connected with a (n−2)-th stage gate driving signal, and when n−2, the third end of said 1st thin-film-transistor is connected with a scan starting signal;

When n≤m−2, a third end of said 2nd thin-film-transistor is connected with a (n+2)-th stage gate driving signal, and when n>m−2, the third end of said 2nd thin-film-transistor is connected with the scan starting signal;

Wherein said scan starting signal is in high voltage level after the liquid crystal display panel is out of power.

Preferably, said node signal control module comprises a 3rd thin-film-transistor and a 4th thin-film-transistor;

A first end of said 3rd thin-film-transistor is connected with a (n+1)-th clock signal, a third end of said 3rd thin-film-transistor is connected with said forward scan control signal, and a second end of said 3rd thin-film-transistor is connected with the third end of said 5th thin-film-transistor;

A first end of said 4th thin-film-transistor is connected with a (n−1)-th clock signal, a third end of said 4th thin-film-transistor is connected with said backward scan control signal, and a second end of said 4th thin-film-transistor is connected with the third end of said 5th thin-film-transistor.

Preferably, said GOA unit further comprises a first capacitor, a second capacitor, and a 10th thin-film-transistor;

A third end of said 10th thin-film-transistor is connected with the second end of said 5th thin-film-transistor, a first end of said 10th thin-film-transistor is connected with the first end of said 9th thin-film-transistor, and a second end of said 10th thin-film-transistor is connected with low voltage signal;

One end of said first capacitor is connected with the first end of said 9th thin-film-transistor, and the other end is connected with low voltage signal;

One end of said second capacitor is connected with the third end of said 7th thin-film-transistor, and the other end is connected with the second end of said 7th thin-film-transistor.

Preferably, said GOA unit further comprises a 12th thin-film-transistor and a 11th thin-film-transistor;

A third end of said 12th thin-film-transistor is connected with the second end of said 1st thin-film-transistor and the second end of said 2nd thin-film-transistor, a second end of said 12th thin-film-transistor is connected with low voltage signal, and a first end of said 12th thin-film-transistor is connected with the third end of said 7th thin-film-transistor;

A third end of said 11th thin-film-transistor is connected with the second end of said 11th thin-film-transistor and further connected with a reset signal, and a first end of said 11th thin-film-transistor is connected with the third end of said 7th thin-film-transistor.

Preferably, said GOA unit further comprises a 15th thin-film-transistor which a third end of said 15th thin-film-transistor is connected with a second global control signal, a first end of said 15th thin-film-transistor is connected with the first end of said 7th thin-film-transistor, and a second end of said 15th thin-film-transistor is connected with the second end of said 7th thin-film-transistor.

Preferably, all thin-film-transistors of said GOA units are n-channel thin-film-transistor.

Preferably, after said liquid crystal display panel is out of power, the forward scan control signal, the backward scan control signal, and all clock signals are in low voltage level, and the first global control signal is in high voltage level.

The present invention further discloses another embodiment of a GOA circuit adapted in a liquid crystal display panel comprising m stages GOA units, wherein a n-th stage GOA unit comprises: an output control module, a forward-backward scan control module, a node signal control module, a signal output module, a first pull-down circuit, a second pull-down circuit, and a pull-up circuit, wherein m≥n≥1;

Wherein said forward-backward scan control module controls said GOA circuit to execute forward scan or backward scan according to whether a forward scan control signal or a backward scan control signal is;

Wherein said output control module is connected with said forward-backward scan control module to control a gate driving signal outputted by n-th stage when said GOA circuit is executing forward scan or backward scan;

Wherein said first pull-down circuit comprises a 7th thin-film-transistor which a first end of said 7th thin-film-transistor is connected with said output control module and a second end of said 7th thin-film-transistor is connected with low voltage signal;

Wherein said signal output module comprises a 5th thin-film-transistor which a first end of said 5th thin-film-transistor is connected with high voltage signal and a second end of said 5th thin-film-transistor is connected with a third end of said 7th thin-film-transistor;

Wherein said node signal control module is connected with a third end of said 5th thin-film-transistor so as to output a clock signal to said 5th thin-film-transistor in order to control said 5th thin-film-transistor as conducting or non-conducting;

Wherein said second pull-down circuit is connected with the third end of said 5th thin-film-transistor and adapted to pull down the voltage level of the third end of said 5th thin-film-transistor when said liquid crystal display panel is out of power so as to control said 5th thin-film-transistor as non-conducting;

Wherein said pull-up circuit comprises an 8th thin-film-transistor which a first end of said 8th thin-film-transistor is connected with the third end of said 7th thin-film-transistor, a second end of said 8th thin-film-transistor is connected with low voltage signal, a third end of said 8th thin-film-transistor is connected with a first global control signal;

Wherein said second pull-down circuit further comprises a 14th thin-film-transistor which a second end of said 14th thin-film-transistor is connected with low voltage signal, a first end of said 14th thin-film-transistor is connected with the third end of said 5th thin-film-transistor, and a third end of said 14th thin-film-transistor is connected with said first global control signal;

Wherein said first end is one of source or drain, said second end is the other, and said third end is gate.

Preferably, said pull-up circuit further comprises a 13th thin-film-transistor which a first end and a third end of said 13th thin-film-transistor are both connected with the third end of said 8th thin-film-transistor, and a second end of said 13th thin-film-transistor is connected with the first end of said 7th thin-film-transistor.

Preferably, said GOA unit further comprises a voltage stabilizing circuit;

Wherein said voltage stabilizing circuit comprises a 9th thin-film-transistor, said output control module comprises a 6th thin-film-transistor, and said forward-backward scan control module comprises a 1st thin-film-transistor and a 2nd thin-film-transistor;

A first end of said 1st thin-film-transistor is connected with a forward scan control signal, a second end of said 1st thin-film-transistor is connected with a first end of said 9th thin-film-transistor;

A third end of said 9th thin-film-transistor is connected with high voltage signal, a second end of said 9th thin-film-transistor is connected with a third end of said 6th thin-film-transistor;

A first end of said 6th thin-film-transistor is connected with a n-th clock signal, a second end of said 6th thin-film-transistor is connected with the first end of said 7th thin-film-transistor, the connected node of said 6th thin-film-transistor and said 7th thin-film-transistor is adapted to be output port of a n-th stage gate driving signal;

A first end of said 2nd thin-film-transistor is connected with a backward scan control signal, a second end of said 2nd thin-film-transistor is connected with the second end of said 1st thin-film-transistor;

Wherein when n>2, a third end of said 1st thin-film-transistor is connected with a (n−2)-th stage gate driving signal, and when n≤2, the third end of said 1st thin-film-transistor is connected with a scan starting signal;

When n≤m−2, a third end of said 2nd thin-film-transistor is connected with a (n+2)-th stage gate driving signal, and when n>m−2, the third end of said 2nd thin-film-transistor is connected with the scan starting signal;

Wherein said scan starting signal is in high voltage level after the liquid crystal display panel is out of power.

Preferably, said node signal control module comprises a 3rd thin-film-transistor and a 4th thin-film-transistor;

A first end of said 3rd thin-film-transistor is connected with a (n+1)-th clock signal, a third end of said 3rd thin-film-transistor is connected with said forward scan control signal, and a second end of said 3rd thin-film-transistor is connected with the third end of said 5th thin-film-transistor;

A first end of said 4th thin-film-transistor is connected with a (n−1)-th clock signal, a third end of said 4th thin-film-transistor is connected with said backward scan control signal, and a second end of said 4th thin-film-transistor is connected with the third end of said 5th thin-film-transistor.

Preferably, said GOA unit further comprises a first capacitor, a second capacitor, and a 10th thin-film-transistor;

A third end of said 10th thin-film-transistor is connected with the second end of said 5th thin-film-transistor, a first end of said 10th thin-film-transistor is connected with the first end of said 9th thin-film-transistor, and a second end of said 10th thin-film-transistor is connected with low voltage signal;

One end of said first capacitor is connected with the first end of said 9th thin-film-transistor, and the other end is connected with low voltage signal;

One end of said second capacitor is connected with the third end of said 7th thin-film-transistor, and the other end is connected with the second end of said 7th thin-film-transistor.

Preferably, said GOA unit further comprises a 12th thin-film-transistor and a 11th thin-film-transistor;

A third end of said 12th thin-film-transistor is connected with the second end of said 1st thin-film-transistor and the second end of said 2nd thin-film-transistor, a second end of said 12th thin-film-transistor is connected with low voltage signal, and a first end of said 12th thin-film-transistor is connected with the third end of said 7th thin-film-transistor;

A third end of said 11th thin-film-transistor is connected with the second end of said 11th thin-film-transistor and further connected with a reset signal, and a first end of said 11th thin-film-transistor is connected with the third end of said 7th thin-film-transistor.

Preferably, said GOA unit further comprises a 15th thin-film-transistor which a third end of said 15th thin-film-transistor is connected with a second global control signal, a first end of said 15th thin-film-transistor is connected with the first end of said 7th thin-film-transistor, and a second end of said 15th thin-film-transistor is connected with the second end of said 7th thin-film-transistor.

Preferably, all thin-film-transistors are n-channel thin-film-transistor.

Preferably, after said liquid crystal display panel is out of power, the forward scan control signal, the backward scan control signal, and all clock signals are in low voltage level, and the first global control signal is in high voltage level.

By implementing present invention, there is advantageous effects as follow: By adding a second pull-down circuit 100 connected with the gate of the 5th thin-film-transistor NT5, when the liquid crystal display panel is out of power and the gate voltage level of 5th thin-film-transistor NT5 is in high voltage level, the second pull-down circuit 100 could still be able to pull down the voltage level of the 5th thin-film-transistor NT5 causing the 5th thin-film-transistor NT5 been controlled as non-conducting. Therefore, the high voltage signal VGH of the first end of the 5th thin-film-transistor NT5 could not be passed to the 7th thin-film-transistor NT7 which prevents signal superposition between low voltage signal VGL and high voltage signal VGH at the gate of the 7th thin-film-transistor NT7. The low voltage signal VGL would be feed into the gate of the 7th thin-film-transistor NT7 via the 8th thin-film-transistor NT8 causing the 7th thin-film-transistor NT7 been controlled as non-conducting, and further prevents the low voltage signal VGL from pulling down the voltage level of n-th stage gate G(n) which the pulling down of the voltage level of n-th stage gate G(n) would cause the thin-film-transistor of pixel unit insufficient active.

In this way, present invention may turn on the pixel units of liquid crystal display panel completely, thereby release the charges accumulated on the electrodes of pixel units by datalines of liquid crystal display panel and eliminate the sticking and flicker of liquid crystal display panel after out of power.

BRIEF DESCRIPTION OF THE DRAWINGS

Accompanying drawings are provided for clearly explanation of technical solutions of present invention. Necessary drawing for the embodiment would be briefed introduced. Apparently, the drawings in the description below are merely some embodiments of present invention, a person skilled in the art can obtain other drawings according to these drawings without creative efforts. In the figures.

DETAILED DESCRIPTION OF PREFERRED EMBODIMENTS

Figure 1:
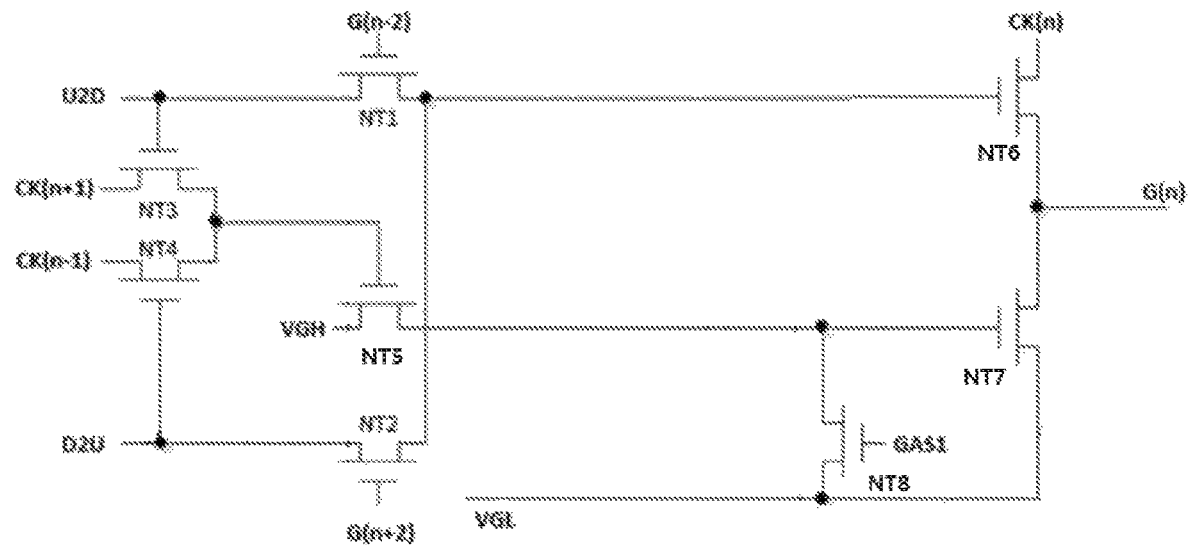
FIG. 1 is a schematic diagram of the n-th GOA unit in a GOA circuit in conventional arts.
Figure 2:
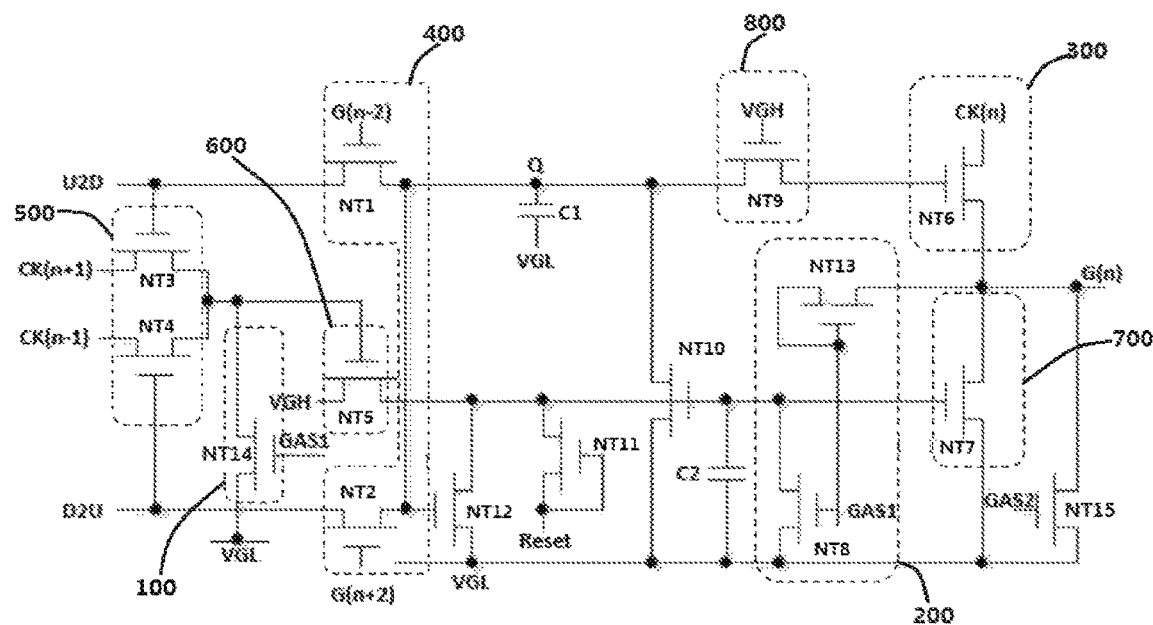
FIG. 2 is a schematic diagram of the n-th GOA unit in a GOA circuit of present invention.

The present invention discloses an embodiment of a GOA circuit adapted in a liquid crystal display panel comprising m stages GOA units, which a FIG. 2 illustrates, wherein a n-th stage GOA unit comprises: an output control module 300, a forward-backward scan control module 400, a node signal control module 500, a signal output module 600, a first pull-down circuit 700, a second pull-down circuit 100, and a pull-up circuit 200, wherein m≥n≥1.

Said forward-backward scan control module 400 controls said GOA circuit to execute forward scan or backward scan according to whether a forward scan control signal U2D or a backward scan control signal D2U is.

Said output control module 300 is connected with said forward-backward scan control module 400 to control a gate driving signal G(n) outputted by n-th stage when said GOA circuit is executing forward scan or backward scan. The output control module 300 is adapted to transmits n-th gate driving signal G(n) to the gatelines connected with the thin-film-transistor of corresponding pixel units (on/off switch of pixel units).

Said first pull-down circuit 700 comprises a 7th thin-film-transistor NT7 which a first end of said 7th thin-film-transistor NT7 is connected with the output port of said output control module 300, and a second end of said 7th thin-film-transistor is connected with low voltage signal VGL.

Said signal output module 600 comprises a 5th thin-film-transistor NT5 which a first end of said 5th thin-film-transistor NT5 is connected with high voltage signal VGH and a second end of said 5th thin-film-transistor NT5 is connected with a third end of said 7th thin-film-transistor NT7.

Said node signal control module 500 is connected with a third end of said 5th thin-film-transistor NT5 so as to output a clock signal to said 5th thin-film-transistor NT5 in order to control said 5th thin-film-transistor NT5 as conducting or non-conducting.

Said second pull-down circuit 100 s connected with the third end of said 5th thin-film-transistor NT5 and adapted to pull down the voltage level of the third end of said 5th thin-film-transistor NT5 when said liquid crystal display panel is out of power so as to control said 5th thin-film-transistor NT5 as non-conducting.

Said pull-up circuit 200 comprises an 8th thin-film-transistor NT8 which a first end of said 8th thin-film-transistor NT8 is connected with the third end of said 7th thin-film-transistor NT7, a second end of said 8th thin-film-transistor NT8 is connected with low voltage signal VGL, a third end of said 8th thin-film-transistor NT8 is connected with a first global control signal GAS1.

Wherein, said first end is one of source or drain, said second end is the other, and said third end is gate.

More specifically, said second pull-down circuit 100 comprises a 14th thin-film-transistor NT14 which a second end of said 14th thin-film-transistor NT14 is connected with low voltage signal VGL, a first end of said 14th thin-film-transistor NT14 is connected with the third end of said 5th thin-film-transistor NT5, and a third end of said 14th thin-film-transistor NT14 is connected with said first global control signal GAS1.

More specifically, said pull-up circuit 200 further comprises a 13th thin-film-transistor NT13; A first end and a third end of said 13th thin-film-transistor NT13 are both connected with the third end of said 8th thin-film-transistor NT8, the first end and the third end of said 13th thin-film-transistor NT13 is also both connected with the first global control signal GAS1, and a second end of said 13th thin-film-transistor NT13 is connected with the first end of said 7th thin-film-transistor NT7.

More specifically, said GOA unit further comprises a voltage stabilizing circuit 800; Said voltage stabilizing circuit 800 comprises a 9th thin-film-transistor NT9, said output control module 300 comprises a 6th thin-film-transistor NT6, and said forward-backward scan control module 400 comprises a 1st thin-film-transistor NT1 and a 2nd thin-film-transistor NT2.

A first end of said 1st thin-film-transistor NT1 is connected with a forward scan control signal U2D, a second end of said 1st thin-film-transistor NT1 is connected with a first end of said 9th thin-film-transistor NT9.

A third end of said 9th thin-film-transistor NT9 is connected with high voltage signal VGH, a second end of said 9th thin-film-transistor NT9 is connected with a third end of said 6th thin-film-transistor NT6.

A first end of said 6th thin-film-transistor NT6 is connected with a n-th clock signal, a second end of said 6th thin-film-transistor NT6 is connected with the first end of said 7th thin-film-transistor NT7, the connected node of said 6th thin-film-transistor NT6 and said 7th thin-film-transistor NT7 is adapted to be output port of a n-th stage gate driving signal G(n).

A first end of said 2nd thin-film-transistor NT2 is connected with a backward scan control signal D2U, a second end of said 2nd thin-film-transistor NT2 is connected with the second end of said 1st thin-film-transistor NT1.

Wherein, when n>2, a third end of said 1st thin-film-transistor NT1 is connected with a (n−2)-th stage gate driving signal G(n−2), and when n≤2, the third end of said 1st thin-film-transistor NT1 is connected with a scan starting signal STV. The scan starting signal STV is in high voltage level after the liquid crystal display panel is out of power.

When n≤m−2, a third end of said 2nd thin-film-transistor NT2 is connected with a (n+2)-th stage gate driving signal G(n+2). and when n>m−2, the third end of said 2nd thin-film-transistor NT2 is connected with the scan starting signal STV.

More specifically, said node signal control module 500 comprises a 3rd thin-film-transistor NT3 and a 4th thin-film-transistor NT4; A first end of said 3rd thin-film-transistor NT4 is connected with a (n+1)-th clock signal, a third end of said 3rd thin-film-transistor NT3 is connected with said forward scan control signal U2D, and a second end of said 3rd thin-film-transistor NT3 is connected with the third end of said 5th thin-film-transistor NT5.

A first end of said 4th thin-film-transistor NT4 is connected with a (n−1)-th clock signal, a third end of said 4th thin-film-transistor NT4 is connected with said backward scan control signal D2U, and a second end of said 4th thin-film-transistor NT4 is connected with the third end of said 5th thin-film-transistor NT5.

There are 4 clock signals in the GOA circuit: a first clock signal, a second clock signal, a third clock signal, and a fourth clock signal. Assumed the n-th clock signal is the fourth clock signal, accordingly, the (n+1)-th clock is the first clock signal. Assumed the n-th clock signal is the first clock signal, accordingly, the (n−1)-th clock is the fourth clock signal. Moreover, assumed the node signal control module 500 of n-th stage GOA unit should be feed in the first and third clock signal, accordingly, the node signal control module 500 of the (n+1)-th stage GOA unit should be feed in the second and fourth clock signal. Therefore, the n-th stage GOA unit and the (n+1)-th stage GOA unit form a GOA repeated unit.

More specifically, said GOA unit further comprises a first capacitor C1, a second capacitor C2, and a 10th thin-film-transistor NT10. The 10th thin-film-transistor NT10 is adapted to control the voltage level of the 6th thin-film-transistor NT6, and the first capacitor C1 and the second capacitor C2 are adapted to store charges.

A third end of said 10th thin-film-transistor NT10 is connected with the second end of said 5th thin-film-transistor NT5, a first end of said 10th thin-film-transistor NT10 is connected with the first end of said 9th thin-film-transistor NT9, and a second end of said 10th thin-film-transistor NT10 is connected with low voltage signal VGL.

One end of said first capacitor C1 is connected with the first end of said 9th thin-film-transistor NT9, and the other end is connected with low voltage signal VGL.

One end of said second capacitor C2 is connected with the third end of said 7th thin-film-transistor NT7, and the other end is connected with the second end of said 7th thin-film-transistor NT7.

More specifically, said GOA unit further comprises a 12th thin-film-transistor NT12 and a 11th thin-film-transistor NT11.

A third end of said 12th thin-film-transistor NT12 is connected with the second end of said 1st thin-film-transistor NT1 and the second end of said 2nd thin-film-transistor NT2, a second end of said 12th thin-film-transistor NT12 is connected with low voltage signal VGL, and a first end of said 12th thin-film-transistor NT12 is connected with the third end of said 7th thin-film-transistor NT7.

A third end of said 11th thin-film-transistor NT11 is connected with the second end of said 11th thin-film-transistor NT11 and further connected with a reset signal, and a first end of said 11th thin-film-transistor NT11 is connected with the third end of said 7th thin-film-transistor NT7. The 11th thin-film-transistor NT11 is adapted to reset the gate of the 7th thin-film-transistor NT7.

More specifically, said GOA unit further comprises a 15th thin-film-transistor NT15 which a third end of said 15th thin-film-transistor NT15 is connected with a second global control signal GAS2, a first end of said 15th thin-film-transistor NT15 is connected with the first end of said 7th thin-film-transistor NT7, and a second end of said 15th thin-film-transistor NT15 is connected with the second end of said 7th thin-film-transistor NT7.

More specifically, all thin-film-transistors of said GOA units are n-channel thin-film-transistor.

More specifically, after said liquid crystal display panel is out of power, the forward scan control signal U2D, the backward scan control signal D2U, and all clock signals CK are in low voltage level, and the first global control signal GAS1 is in high voltage level.

Figure 3:
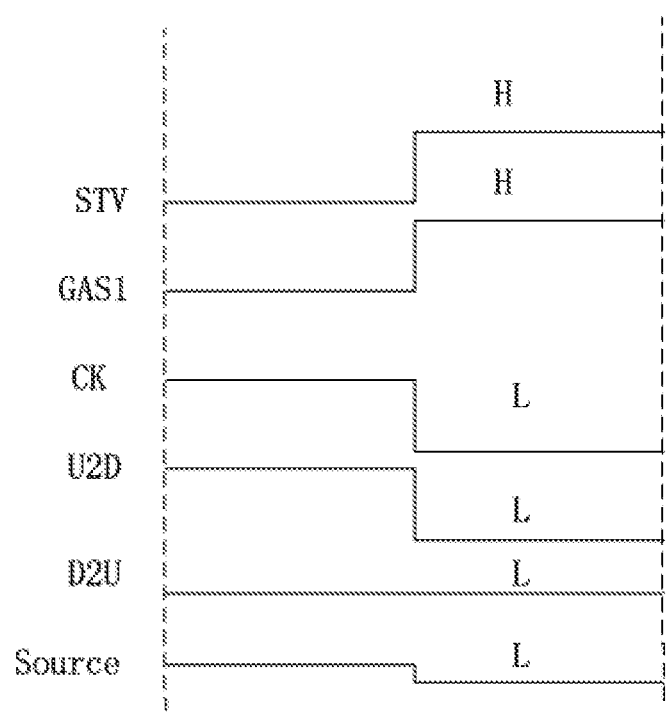
FIG. 3 is a sequence diagram of signals after the liquid crystal display panel is out of power of present invention.

Referring to FIG. 3 for a sequence diagram of signals after the liquid crystal display panel is out of power. The scan starting signal STV, and the first global control signal GAS1 is in high voltage level (H). The forward scan control signal U2D, the backward scan control signal D2U, and all clock signals CK are in low voltage level (L). The 14th thin-film-transistor NT14 is conducting. The voltage level of the gate of 5th thin-film-transistor NT5 is pulled low, causing the 5th thin-film-transistor NT5 is non-conducting. The 8th thin-film-transistor NT8 is conducting. The voltage level of the gate of 7th thin-film-transistor NT7 is pulled low by low voltage signal VGL, causing the 7th thin-film-transistor NT7 is non-conducting. The n-th stage gate driving signal G(n) outputted by the 6th thin-film-transistor NT6 is not pulled low so as to control thin-film-transistors of corresponding pixel units as conducting. As the FIG. 3 further illustrates, the voltage level of datalines Source is also changed to low voltage level.

The GOA circuit in present invention may be adapted not only in forward scan scenario of liquid crystal display panel (the forward scan control signal U2D is in high voltage level; the backward scan control signal D2U is in low voltage level) but also in backward scan scenario (the forward scan control signal U2D is in low voltage level; the backward scan control signal D2U is in high voltage level) which realizes the feature of turning on thin-film-transistors of pixel units by lines and the feature of All Gate ON when liquid crystal display panel is out of power abnormally.

By adding a second pull-down circuit 100 connected with the gate of the 5th thin-film-transistor NT5, when the liquid crystal display panel is out of power and the gate voltage level of 5th thin-film-transistor NT5 is in high voltage level, the second pull-down circuit 100 could still be able to pull down the voltage level of the 5th thin-film-transistor NT5 causing the 5th thin-film-transistor NT5 been controlled as non-conducting. Therefore, the high voltage signal VGH of the first end of the 5th thin-film-transistor NT5 could not be passed to 7th thin-film-transistor NT7 which prevents signal superposition between low voltage signal VGL and high voltage signal VGH at the gate of 7th thin-film-transistor NT7. The low voltage signal VGL would be feed into the gate of 7th thin-film-transistor NT7 via the 8th thin-film-transistor NT8 causing the 7th thin-film-transistor NT7 been controlled as non-conducting, and further prevents the low voltage signal VGL from pulling down the voltage level of n-th stage gate G(n) which the pulling down of the voltage level of n-th stage gate G(n) would cause the thin-film-transistor of pixel unit insufficient active.

Therefore, present invention may turn on the pixel units of liquid crystal display panel completely, thereby release the charges accumulated on the electrodes of pixel units by datalines of liquid crystal display panel and eliminate the sticking and flicker of liquid crystal display panel after out of power which improves user experience.

Detail explanation with aforesaid embodiments of present invention is not for limiting here. Without departing from the concept of present invention, equivalent embodiments could be reached by simple deductions, re-modification, and substitutions which should be deemed and included in the protection of present invention.

What is claimed is:

1. A Gate Driver On Array (GOA) circuit adapted in a liquid crystal display panel comprising m stages GOA units, wherein a n-th stage GOA unit comprises: an output control module, a forward-backward scan control module, a node signal control module, a signal output module, a first pull-down circuit, a second pull-down circuit, and a pull-up circuit, wherein m≥n≥1;

wherein said forward-backward scan control module controls said GOA circuit to execute forward scan or backward scan according to whether a forward scan control signal or a backward scan control signal is;

wherein said output control module is connected with said forward-backward scan control module to control a gate driving signal outputted by n-th stage when said GOA circuit is executing forward scan or backward scan;

wherein said first pull-down circuit comprises a 7th thin-film-transistor which a first end of said 7th thin-film-transistor is connected with said output control module and a second end of said 7th thin-film-transistor is connected with a low voltage signal;

wherein said signal output module comprises a 5th thin-film-transistor which a first end of said 5th thin-film-transistor is connected with a high voltage signal and a second end of said 5th thin-film-transistor is connected with a third end of said 7th thin-film-transistor;

wherein said node signal control module is connected with a third end of said 5th thin-film-transistor so as to output a clock signal to said 5th thin-film-transistor in order to control said 5th thin-film-transistor as conducting or non-conducting;

wherein said second pull-down circuit is connected with the third end of said 5th thin-film-transistor and adapted to pull down the voltage level of the third end of said 5th thin-film-transistor when said liquid crystal display panel is out of power so as to control 5th thin-film-transistor as non-conducting;

wherein said pull-up circuit comprises an 8th thin-film-transistor which a first end of said 8th thin-film-transistor is connected with the third end of said 7th thin-film-transistor, a second end of said 8th thin-film-transistor is connected with the low voltage signal, a third end of said 8th thin-film-transistor is connected with a first global control signal; and wherein said first end of each of said 5th thin-film-transistor, said 7th thin-film-transistor and said 8th thin-film-transistor is one of a source and a drain, said second end of each of said 5th thin-film-transistor, said 7th thin-film-transistor and said 8th thin-film-transistor is the other of the source and the drain, and said third end of each of said 5th thin-film-transistor, said 7th thin-film-transistor and said 8th thin-film-transistor is a gate.

2. The GOA circuit according to claim 1, wherein said pull-up circuit further comprises a 13th thin-film-transistor which a first end and a third end of said 13th thin-film-transistor are both connected with the third end of said 8th thin-film-transistor, and a second end of said 13th thin-film-transistor is connected with the first end of said 7th thin-film-transistor.

3. The GOA circuit according to claim 1, wherein said GOA unit further comprises a voltage stabilizing circuit;

wherein said voltage stabilizing circuit comprises a 9th thin-film-transistor, said output control module comprises a 6th thin-film-transistor, and said forward-backward scan control module comprises a 1st thin-film-transistor and a 2nd thin-film-transistor;

a first end of said 1st thin-film-transistor is connected with a forward scan control signal, a second end of said 1st thin-film-transistor is connected with a first end of said 9th thin-film-transistor;

a third end of said 9th thin-film-transistor is connected with the high voltage signal, a second end of said 9th thin-film-transistor is connected with a third end of said 6th thin-film-transistor;

a first end of said 6th thin-film-transistor is connected with a n-th clock signal, a second end of said 6th thin-film-transistor is connected with the first end of said 7th thin-film-transistor, the connected node of said 6th thin-film-transistor and said 7th thin-film-transistor is adapted to be output port of a n-th stage gate driving signal; and a first end of said 2nd thin-film-transistor is connected with a backward scan control signal, a second end of said 2nd thin-film-transistor is connected with the second end of said 1st thin-film-transistor;

wherein when n>2, a third end of said 1st thin-film-transistor is connected with a (n−2)-th stage gate driving signal, and when n≤2, the third end of said 1st thin-film-transistor is connected with a scan starting signal;

when n≤m−2, a third end of said 2nd thin-film-transistor is connected with a (n+2)-th stage gate driving signal, and when n>m−2, the third end of said 2nd thin-film-transistor is connected with the scan starting signal; and wherein said scan starting signal is in high voltage level after the liquid crystal display panel is out of power.

4. The GOA circuit according to claim 1, wherein said node signal control module comprises a 3rd thin-film-transistor and a 4th thin-film-transistor;

a first end of said 3rd thin-film-transistor is connected with a (n+1)-th clock signal, a third end of said 3rd thin-film-transistor is connected with said forward scan control signal, and a second end of said 3rd thin-film-transistor is connected with the third end of said 5th thin-film-transistor; and a first end of said 4th thin-film-transistor is connected with a (n−1)-th clock signal, a third end of said 4th thin-film-transistor is connected with said backward scan control signal, and a second end of said 4th thin-film-transistor is connected with the third end of said 5th thin-film-transistor.

5. The GOA circuit according to claim 3, wherein said GOA unit further comprises a first capacitor, a second capacitor and a 10th thin-film-transistor;

a third end of said 10th thin-film-transistor is connected with the second end of said 5th thin-film-transistor, a first end of said 10th thin-film-transistor is connected with the first end of said 9th thin-film-transistor, and a second end of said 10th thin-film-transistor is connected with the low voltage signal;

one end of said first capacitor is connected with the first end of said 9th thin-film-transistor, and the other end is connected with the low voltage signal; and one end of said second capacitor is connected with the third end of said 7th thin-film-transistor, and the other end is connected with the second end of said 7th thin-film-transistor.

6. The GOA circuit according to claim 3, wherein said GOA unit further comprises a 12th thin-film-transistor and a 11th thin-film-transistor;

a third end of said 12th thin-film-transistor is connected with the second end of said 1st thin-film-transistor and the second end of said 2nd thin-film-transistor, a second end of said 12th thin-film-transistor is connected with the low voltage signal, and a first end of said 12th thin-film-transistor is connected with the third end of said 7th thin-film-transistor;

a third end of said 11th thin-film-transistor is connected with the second end of said 11th thin-film-transistor and further connected with a reset signal, and a first end of said 11th thin-film-transistor is connected with the third end of said 7th thin-film-transistor.

7. The GOA circuit according to claim 1, wherein said GOA unit further comprises a 15th thin-film-transistor which a third end of said 15th thin-film-transistor is connected with a second global control signal, a first end of said 15th thin-film-transistor is connected with the first end of said 7th thin-film-transistor, and a second end of said 15th thin-film-transistor is connected with the second end of said 7th thin-film-transistor.

8. The GOA circuit according to claim 1, wherein all thin-film-transistors of said GOA units are n-channel thin-film-transistor.

9. The GOA circuit according to claim 1, after said liquid crystal display panel is out of power, the forward scan control signal, the backward scan control signal, and all clock signals are in low voltage level, and the first global control signal is in high voltage level.

10. A Gate Driver On Array (GOA) circuit adapted in a liquid crystal display panel comprising m stages GOA units, wherein a n-th stage GOA unit comprises: an output control module, a forward-backward scan control module, a node signal control module, a signal output module, a first pull-down circuit, a second pull-down circuit, and a pull-up circuit, wherein m≥n≥1;
- wherein said forward-backward scan control module controls said GOA circuit to execute forward scan or backward scan according to a forward scan control signal or a backward scan control signal;
- wherein said output control module is connected with said forward-backward scan control module to control a gate driving signal outputted by n-th stage when said GOA circuit is executing forward scan or backward scan;
- wherein said first pull-down circuit comprises a 7th thin-film-transistor which a first end of said 7th thin-film-transistor is connected with said output control module and a second end of said 7th thin-film-transistor is connected with a low voltage signal;
- wherein said signal output module comprises a 5th thin-film-transistor which a first end of said 5th thin-film-transistor is connected with a high voltage signal and a second end of said 5th thin-film-transistor is connected with a third end of said 7th thin-film-transistor;
- wherein said node signal control module is connected with a third end of said 5th thin-film-transistor so as to output a clock signal to said 5th thin-film-transistor in order to control said 5th thin-film-transistor as conducting or non-conducting;
- wherein said second pull-down circuit is connected with the third end of said 5th thin-film-transistor and adapted to pull down the voltage level of the third end of said 5th thin-film-transistor when said liquid crystal display panel is out of power so as to control said 5th thin-film-transistor as non-conducting;
- wherein said pull-up circuit comprises an 8th thin-film-transistor which a first end of said 8th thin-film-transistor is connected with the third end of said 7th thin-film-transistor, a second end of said 8th thin-film-transistor is connected with the low voltage signal, a third end of said 8th thin-film-transistor is connected with a first global control signal;
- wherein said second pull-down circuit further comprises a 14th thin-film-transistor which a second end of said 14th thin-film-transistor is connected with the low voltage signal, a first end of said 14th thin-film-transistor is connected with the third end of said 5th thin-film-transistor, and a third end of said 14th thin-film-transistor is connected with said first global control signal; and
- wherein said first end of each of said 5th thin-film-transistor, said 7th thin-film-transistor, said 8th thin-film-transistor and said 14th thin-film-transistor is one of a source and a drain, said second end of each of said 5th thin-film-transistor, said 7th thin-film-transistor, said 8th thin-film-transistor and said 14th thin-film-transistor is the other of the source and the drain, and said third end of each of said 5th thin-film-transistor, said 7th thin-film-transistor, said 8th thin-film-transistor and said 14th thin-film-transistor is a gate.

11. The GOA circuit according to claim 10, wherein said pull-up circuit further comprises a 13th thin-film-transistor which a first end and a third end of said 13th thin-film-transistor are both connected with the third end of said 8th thin-film-transistor, and a second end of said 13th thin-film-transistor is connected with the first end of said 7th thin-film-transistor.

12. The GOA circuit according to claim 10, wherein said GOA unit further comprises a voltage stabilizing circuit;
- wherein said voltage stabilizing circuit comprises a 9th thin-film-transistor, said output control module comprises a 6th thin-film-transistor, and said forward-backward scan control module comprises a 1st thin-film-transistor and a 2nd thin-film-transistor;
- a first end of said 1st thin-film-transistor is connected with a forward scan control signal, a second end of said 1st thin-film-transistor is connected with a first end of said 9th thin-film-transistor;
- a third end of said 9th thin-film-transistor is connected with the high voltage signal, a second end of said 9th thin-film-transistor is connected with a third end of said 6th thin-film-transistor;
- a first end of said 6th thin-film-transistor is connected with a n-th clock signal, a second end of said 6th thin-film-transistor is connected with the first end of said 7th thin-film-transistor, the connected node of said 6th thin-film-transistor and said 7th thin-film-transistor is adapted to be output port of a n-th stage gate driving signal; and
- a first end of said 2nd thin-film-transistor is connected with a backward scan control signal, a second end of said 2nd thin-film-transistor is connected with the second end of said 1st thin-film-transistor;
- wherein when n>2, a third end of said 1st thin-film-transistor is connected with a (n−2)-th stage gate driving signal, and when n≤2, the third end of said 1st thin-film-transistor is connected with a scan starting signal;
- when n≤m−2, a third end of said 2nd thin-film-transistor is connected with a (n+2)-th stage gate driving signal, and when n>m−2, the third end of said 2nd thin-film-transistor is connected with the scan starting signal; and
- wherein said scan starting signal is in high voltage level after the liquid crystal display panel is out of power.

13. The GOA circuit according to claim 12 wherein said GOA unit further comprises a first capacitor, a second capacitor, and a 10th thin-film-transistor;
- a third end of said 10th thin-film-transistor is connected with the second end of said 5th thin-film-transistor, a first end of said 10th thin-film-transistor is connected with the first end of said 9th thin-film-transistor, and a second end of said 10th thin-film-transistor is connected with the low voltage signal;
- one end of said first capacitor is connected with the first end of said 9th thin-film-transistor, and the other end is connected with the low voltage signal; and one end of said second capacitor is connected with the third end of said 7th thin-film-transistor, and the other end is connected with the second end of said 7th thin-film-transistor.

14. The GOA circuit according to claim 12, wherein said GOA unit further comprises a 12th thin-film-transistor and a 11th thin-film-transistor;
   a third end of said 12th thin-film-transistor is connected with the second end of said 1st thin-film-transistor and the second end of said 2nd thin-film-transistor, a second end of said 12th thin-film-transistor is connected with the low voltage signal, and a first end of said 12th thin-film-transistor is connected with the third end of said 7th thin-film-transistor;
   a third end of said 11th thin-film-transistor is connected with the second end of said 11th thin-film-transistor and further connected with a reset signal, and a first end of said 11th thin-film-transistor is connected with the third end of said 7th thin-film-transistor.

15. The GOA circuit according to claim 10, wherein said node signal control module comprises a 3rd thin-film-transistor and a 4th thin-film-transistor;
   a first end of said 3rd thin-film-transistor is connected with a (n+1)-th clock signal, a third end of said 3rd thin-film-transistor is connected with said forward scan control signal, and a second end of said 3rd thin-film-transistor is connected with the third end of said 5th thin-film-transistor; and
   a first end of said 4th thin-film-transistor is connected with a (n−1)-th clock signal, a third end of said 4th thin-film-transistor is connected with said backward scan control signal, and a second end of said 4th thin-film-transistor is connected with the third end of said 5th thin-film-transistor.

16. The GOA circuit according to claim 10, wherein said GOA unit further comprises a 15th thin-film-transistor which a third end of said 15th thin-film-transistor is connected with a second global control signal, a first end of said 15th thin-film-transistor is connected with the first end of said 7th thin-film-transistor, and a second end of said 15th thin-film-transistor is connected with the second end of said 7th thin-film-transistor.

17. The GOA circuit according to claim 10, wherein all thin-film-transistors are n-channel thin-film-transistor.

18. The GOA circuit according to claim 10, after said liquid crystal display panel is out of power, the forward scan control signal, the backward scan control signal, and all clock signals are in low voltage level, and the first global control signal is in high voltage level.

* * * * *